United States Patent
Lai et al.

(10) Patent No.: US 9,652,649 B2
(45) Date of Patent: May 16, 2017

(54) CHIP-TYPE ANTENNA DEVICE AND CHIP STRUCTURE

(71) Applicant: AUDEN TECHNO CORP., Taoyuan County (TW)

(72) Inventors: Shih-Chi Lai, Miaoli County (TW); Tzu-Hsiang Chien, Taoyuan County (TW); Cheng-Min Yang, Kaohsiung (TW)

(73) Assignee: AUDEN TECHNO CORP., Taoyuan County (TW)

( * ) Notice: Subject to any disclaimer, the term of this patent is extended or adjusted under 35 U.S.C. 154(b) by 373 days.

(21) Appl. No.: 14/321,898

(22) Filed: Jul. 2, 2014

(65) Prior Publication Data

US 2016/0006125 A1   Jan. 7, 2016

(51) Int. Cl.
*H01Q 1/48* (2006.01)
*H01Q 1/52* (2006.01)
*G06K 7/10* (2006.01)
*H01Q 9/04* (2006.01)
*G06K 7/14* (2006.01)
(Continued)

(52) U.S. Cl.
CPC ....... *G06K 7/10891* (2013.01); *G06K 7/1091* (2013.01); *G06K 7/10396* (2013.01); *G06K 7/10554* (2013.01); *G06K 7/10722* (2013.01); *G06K 7/1443* (2013.01); *H01Q 1/2283* (2013.01); *H01Q 1/52* (2013.01); *H01Q 9/045* (2013.01); *H01Q 9/42* (2013.01)

(58) Field of Classification Search
CPC .......... H01Q 1/2283; H01Q 1/44; H01Q 1/48; H01Q 1/50; H01Q 1/52; H01Q 1/526; H01Q 9/04; H01Q 9/045; H01Q 9/06; H01Q 9/42; H01Q 1/22; H01Q 23/00; H01Q 9/0457; H01Q 1/38; H01Q 9/0407
USPC ........ 343/700 MS, 702, 846, 720, 841, 848, 343/872; 257/701, 723, 724, 725, 728
See application file for complete search history.

(56) References Cited

U.S. PATENT DOCUMENTS 5,666,272 A * 9/1997 Moore .................... B81B 7/007
257/678
6,982,879 B1 * 1/2006 Franca-Neto ........ H01Q 9/0407
343/700 MS
(Continued)

*Primary Examiner* — Dameon E Levi
*Assistant Examiner* — Awat Salih
(74) *Attorney, Agent, or Firm* — Li & Cai Intellectual Property (USA) Office

(57) ABSTRACT

A chip structure for mounting on a clearance area of a printed circuit board includes a packaged chip and a monopole coupling antenna. The packaged chip has an insulating body, an electronic component embedded in the insulating body, and a plurality of grounding pads electrically connected to the electronic component. The monopole coupling antenna has a grounding radiating metal and a monopole radiating metal. The packaged chip is electrically connected to the grounding radiating metal by the grounding pads. The monopole radiating metal is disposed on the insulating body and spaced apart from the electronic component and the grounding radiating metal. The monopole radiating metal is configured to couple the grounding radiating metal and the electronic component by using a feeding circuit to connect the packaged chip and the monopole radiating metal and using a grounding circuit to connect the grounding radiating metal and the printed circuit board.

10 Claims, 6 Drawing Sheets

(51) Int. Cl.
*H01Q 1/22* (2006.01)
*H01Q 9/42* (2006.01)

(56) References Cited

U.S. PATENT DOCUMENTS

| | | | |
|---|---|---|---|
| 8,018,375 B1* | 9/2011 | Alexopoulos | H01Q 19/10 342/175 |
| 8,874,048 B2* | 10/2014 | Tsutsumi | H01L 23/552 343/841 |
| 8,952,521 B2* | 2/2015 | Wojnowski | H01L 23/49816 257/675 |
| 2006/0092079 A1* | 5/2006 | de Rochemont | H01Q 1/362 343/700 MS |
| 2008/0029886 A1* | 2/2008 | Cotte | H01L 23/66 257/728 |
| 2008/0158063 A1* | 7/2008 | Zeng | H01Q 1/2283 343/700 MS |
| 2008/0158091 A1* | 7/2008 | Imaoka | H01Q 1/2283 343/851 |
| 2008/0291115 A1* | 11/2008 | Doan | H01Q 1/38 343/893 |
| 2009/0015485 A1* | 1/2009 | Floyd | H01Q 9/0457 343/700 MS |
| 2009/0102728 A1* | 4/2009 | Gamand | H01Q 1/38 343/702 |
| 2009/0256752 A1* | 10/2009 | Akkermans | G06K 19/07749 343/700 MS |
| 2009/0289343 A1* | 11/2009 | Chiu | H01L 23/3128 257/690 |
| 2009/0315797 A1* | 12/2009 | Rofougaran | H01Q 1/2283 343/787 |
| 2010/0230806 A1* | 9/2010 | Huang | H01L 23/50 257/723 |
| 2011/0163919 A1* | 7/2011 | Suzuki | H01L 23/552 343/700 MS |
| 2012/0062439 A1* | 3/2012 | Liao | H01L 23/481 343/841 |
| 2012/0193810 A1* | 8/2012 | Tsutsumi | H01L 23/66 257/774 |
| 2013/0292808 A1* | 11/2013 | Yen | H01L 23/552 257/660 |
| 2014/0028518 A1* | 1/2014 | Arnold | H01Q 1/526 343/841 |
| 2014/0110841 A1* | 4/2014 | Beer | H01L 23/49822 257/738 |
| 2014/0145884 A1* | 5/2014 | Dang | H01Q 1/2283 343/700 MS |
| 2014/0152509 A1* | 6/2014 | Liu | H01Q 9/0407 343/700 MS |
| 2014/0168014 A1* | 6/2014 | Chih | H01L 24/19 343/700 MS |
| 2014/0239427 A1* | 8/2014 | Huang | H01L 21/76898 257/428 |
| 2014/0293529 A1* | 10/2014 | Nair | H01Q 1/2291 361/679.31 |
| 2015/0061924 A1* | 3/2015 | Binzer | H01L 23/66 342/175 |
| 2015/0280327 A1* | 10/2015 | Spella | H01Q 19/10 342/5 |

\* cited by examiner

CHIP-TYPE ANTENNA DEVICE AND CHIP STRUCTURE

BACKGROUND OF THE DISCLOSURE

1. Field of the Disclosure

The instant disclosure relates to an antenna; more particular, to a chip-type antenna device and chip structure.

2. Description of Related Art

The antenna device is the essential part of the wireless communication apparatus (e.g., cell phone or smart phone). The conventional antenna device includes a circuit board and an antenna. The circuit board defines a clearance area, and the clearance area is only provided for mounting the antenna. Moreover, the clearance area is formed without any metal to prevent interference with the antenna. However, the wireless communication apparatus is gradually smaller, thus the clearance area of the circuit board is gradually smaller, such that the antenna is gradually closer to the other components of the wireless communication apparatus. Thus, the design of the antenna device needs to considerate the proper use of the circuit board and to meet the requirements of the performance of the antenna.

To achieve the abovementioned improvement, the inventors strive through industrial experience and academic research to present the instant disclosure, which can provide additional improvement as mentioned above.

SUMMARY OF THE DISCLOSURE

One embodiment of the instant disclosure provides a chip-type antenna device and a chip structure capable of combining a monopole coupling antenna to a packaged chip for effectively utilizing a circuit board.

The chip-type antenna device provided by the instant disclosure comprises: a circuit board having a grounding portion; a packaged chip having an insulating body and at least one electronic component embedded in the insulating body, wherein the packaged chip has a plurality of grounding pads and a plurality of signal pads, and the grounding pads and the signal pads are exposed from the insulating body and are electrically connected to the electronic component; a monopole coupling antenna, comprising: a grounding radiating metal disposed on the circuit board, wherein the grounding pads are connected to the grounding radiating metal; and a monopole radiating metal disposed on the insulating body of the packaged chip, the monopole radiating metal having a feeding point, wherein the monopole radiating metal is arranged apart from the electronic component and the grounding radiating metal; a grounding circuit disposed on the circuit board and connected to the grounding portion of the circuit board and the grounding radiating metal; and a feeding circuit electrically connected to the feeding point of the monopole radiating metal and one of the signal pads of the packaged chip; wherein the monopole radiating metal is configured to non-contact coupling with the grounding radiating metal and the electronic component, when the packaged chip transmits a signal to the monopole radiating metal via the feeding circuit.

The chip structure provided by the instant disclosure for mounting on a clearance area of a circuit board comprises: a packaged chip having an insulating body and at least one electronic component embedded in the insulating body, wherein the packaged chip has a plurality of grounding pads exposed from the packaged chip and the plurality of grounding pads are electrically connected to the electronic component; and a monopole coupling antenna, comprising: a grounding radiating metal for being disposed on the clearance area of the circuit board, wherein the grounding pads are connected to the grounding radiating metal; and a monopole radiating metal disposed on the insulating body of the packaged chip, the monopole radiating metal having a feeding point, wherein the monopole radiating metal is arranged apart from the electronic component and the grounding radiating metal; wherein when the packaged chip is electrically connected to the feeding point of the monopole radiating metal by a feeding circuit, and the grounding radiating metal is connected to the circuit board by a grounding circuit, the packaged chip transmits a signal to the monopole radiating metal via the feeding circuit, and the monopole radiating metal is coupled in a non-contact manner with the grounding radiating metal and the electronic component during.

Base on the above, the chip-type antenna device of the instant disclosure can operate the function of the monopole coupling antenna by combining the monopole coupling antenna to the packaged chip.

It should be noted that if taking an antenna on a chip, the weak performance of the antenna will be generated by the antenna closer to the metallic portion of the electronic component of the chip. But the chip-type antenna device of the instant disclosure can combine the monopole coupling antenna to the packaged chip without interference for effectively utilizing the circuit board and providing maximum energy output.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
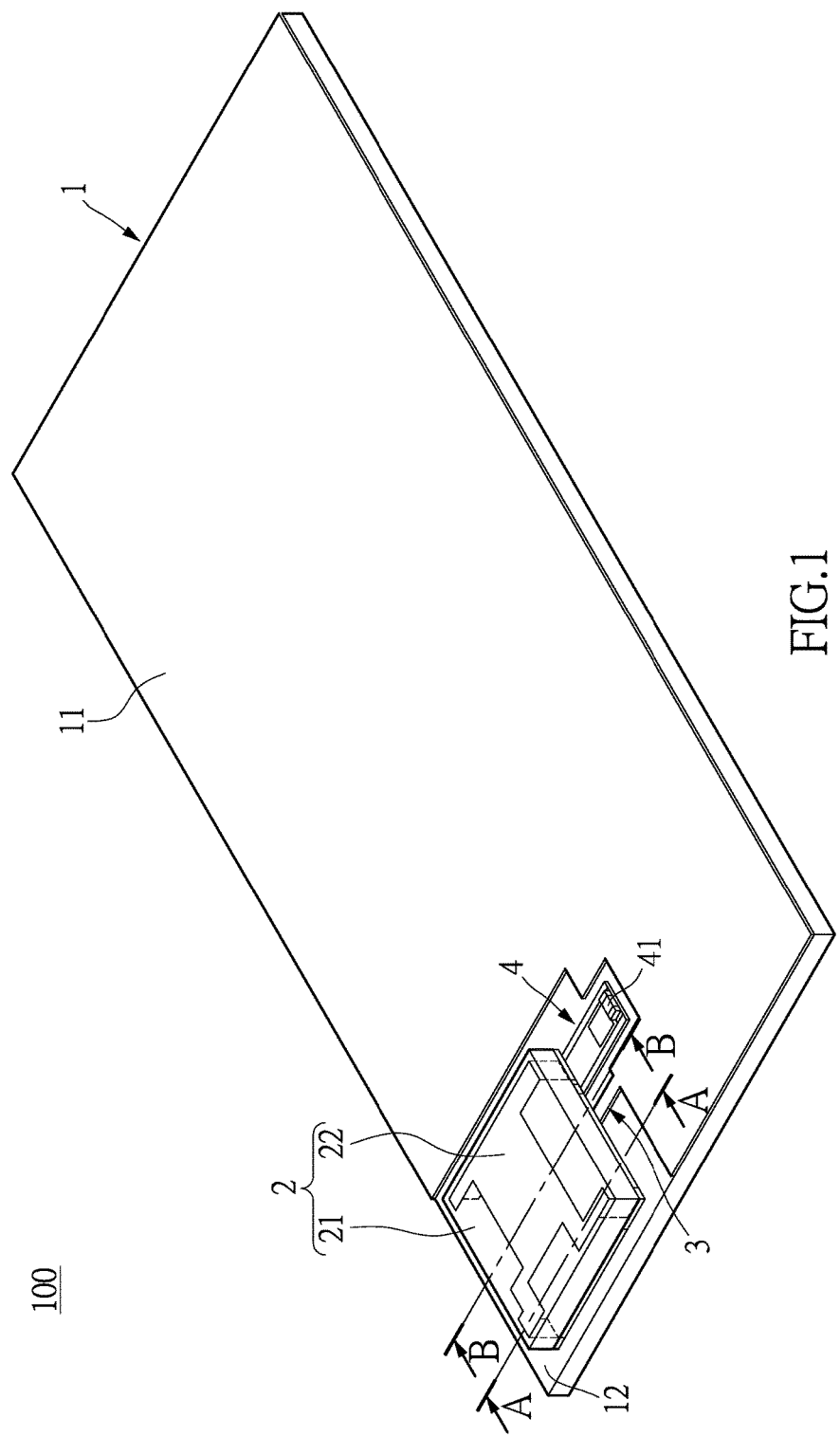
FIG. 1 is a perspective view showing a chip-type antenna device according to the instant disclosure.

Please refer to FIG. 1, which shows an embodiment of the instant disclosure. The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

Figure 2:
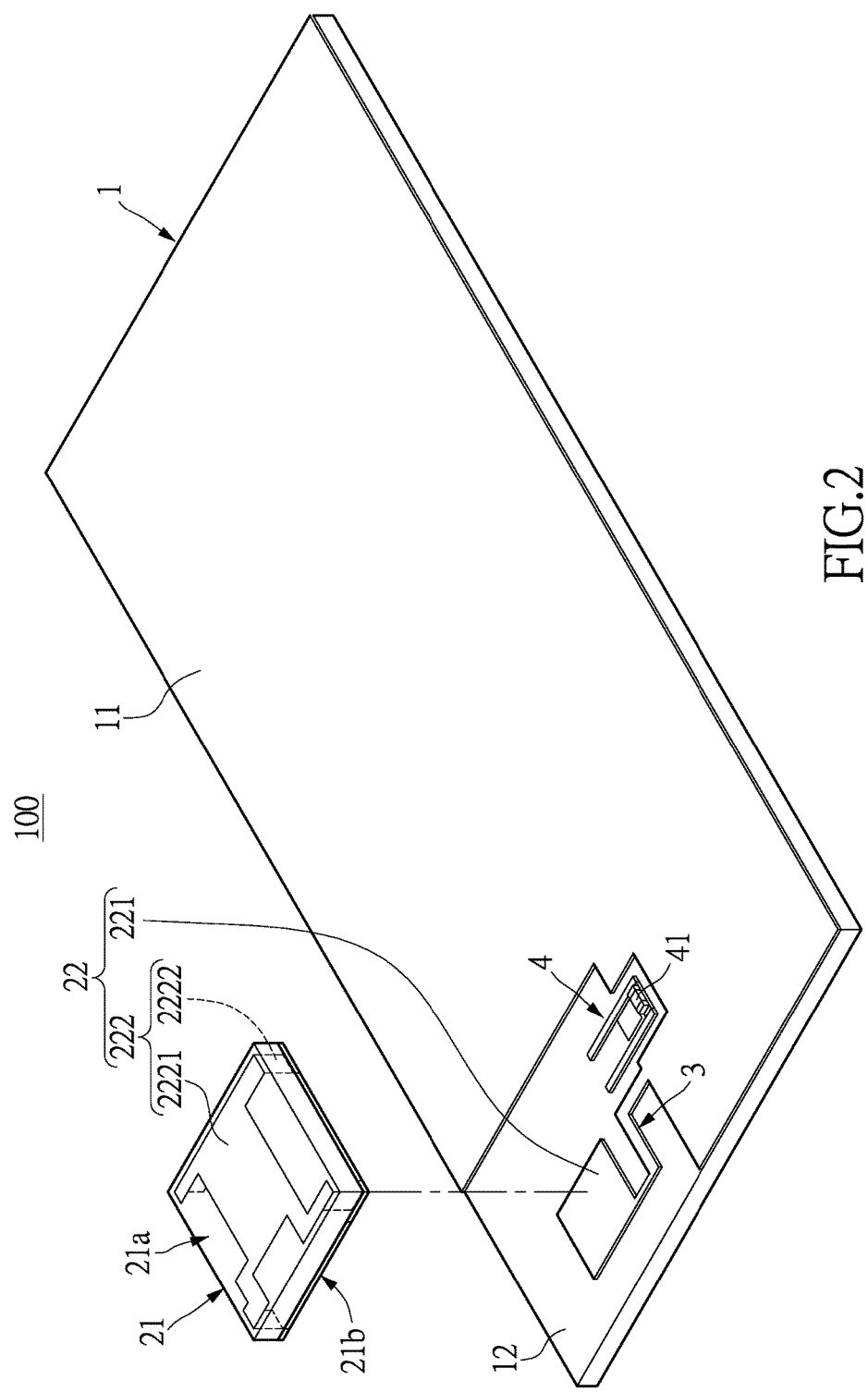
FIG. 2 is an exploded view of FIG. 1.
Figure 3:
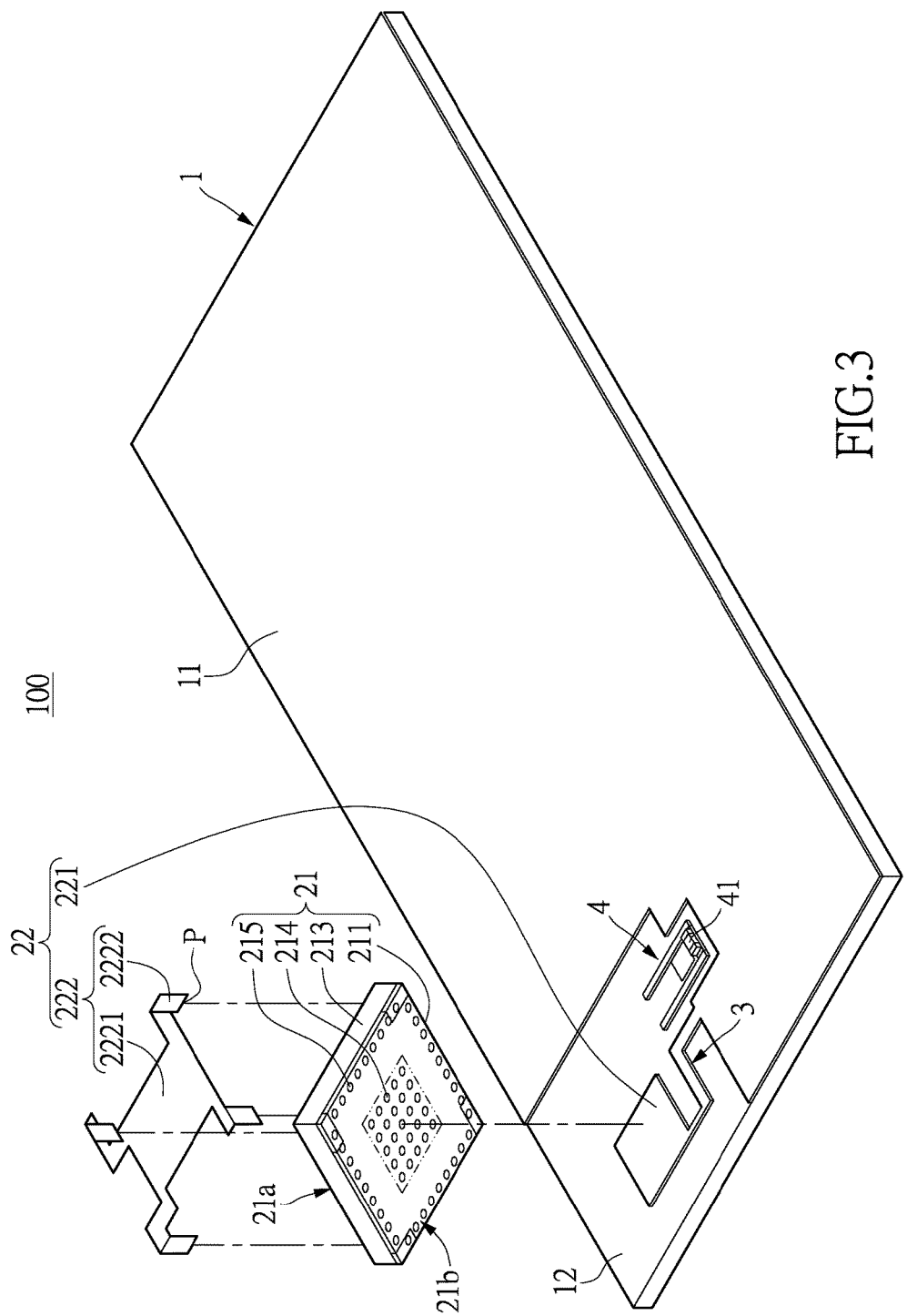
FIG. 3 is an exploded view of FIG. 1 in another viewing angle.

Please refer to FIGS. 1 through 3. The instant embodiment provides a chip-type antenna device 100 to be applied for the wireless communication apparatus. The chip-type antenna device 100 includes a circuit board 1, a chip structure 2, a grounding circuit 3, and a feeding circuit 4. The chip structure 2, the grounding circuit 3, and the feeding circuit 4 are disposed on the circuit board 1.

The circuit board 1 has a grounding portion 11. The circuit board 1 in the instant embodiment is the printed circuit board mounted or disposed in the wireless communication apparatus for providing the installation of the relative components. In order to conveniently explain the instant disclosure, FIG. 1 shows the grounding portion 11 of the circuit board 1 being a sheet-like construction arranged at the outer layer of the circuit board 1. However, in practical use, the grounding portion 11 of the circuit board 1 can be provided with an insulating paint, a circuit layer, or the other components.

The circuit board 1 defines a clearance area 12 at one corner thereof and an available area outside the clearance area 12. The clearance area 12 in the instant embodiment is similar to the clearance area of the conventional antenna device, that is to say, the clearance area of the conventional antenna device is only provided for mounting the antenna to prevent any metal or component from interfering with the antenna. At the same reasons, the clearance area 12 in FIG. 1 indicates a portion of the circuit board 1 not covered by the grounding portion 11.

Figure 4:
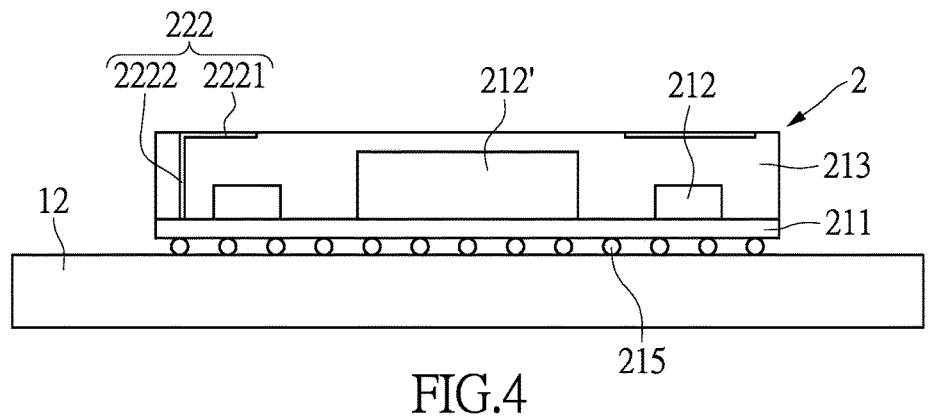
FIG. 4 is a cross-sectional view of FIG. 1 along line A-A.
Figure 5:
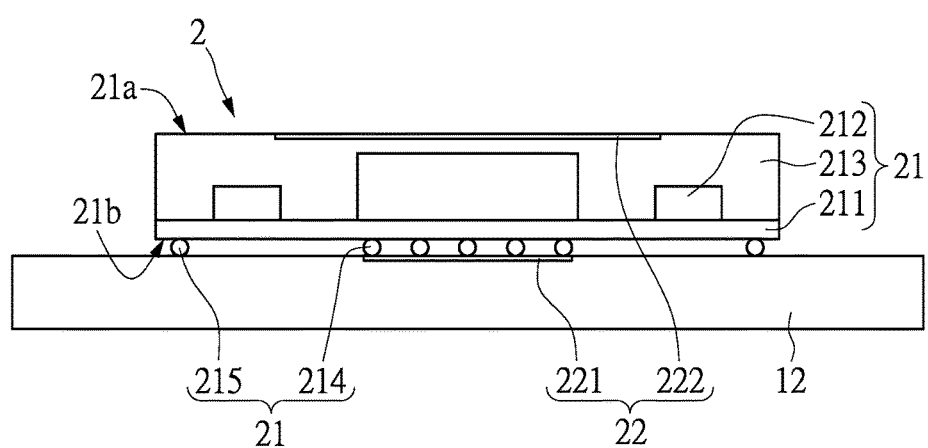
FIG. 5 is a cross-sectional view of FIG. 1 along line B-B.

The chip structure 2 has a packaged chip 21 and a monopole coupling antenna 22. The packaged chip 21 has a cubic construction and includes a substrate 211, a plurality of electronic components 212 (as shown in FIG. 4 or FIG. 5), and an insulating body 213. The electronic components 212 can be an IC die, a resistor, a capacitor, a inductors, or other components. The electronic components 212 are mounted or disposed on the substrate 211 and embedded in the insulating body 213.

Moreover, the packaged chip 21 has a plurality of grounding pads 214 and a plurality of signal pads 215. The grounding pads 214 and the signal pads 215 are formed on a surface of the substrate 211 without mounting any electronic component 212, and the grounding pads 214 and the signal pads 215 are exposed from the insulating body 213. The grounding pads 214 are in an matrix arrangement, the signal pads 215 are approximately in a square-ring arrangement outside the grounding pads 214, and a distance between any signal pad 215 and the adjacent grounding pad 214 is greater than any two adjacent signal pads 215.

Specifically, the packaged chip 21 has a top surface 21a and an opposite bottom surface 21b. The grounding pads 214 and the signal pads 215 are exposed from the bottom surface 21b of the packaged chip 21. Moreover, the electronic components 212 are electrically connected to the grounding pads 214 and the signal pads 215. The signal pads 215 has an antenna pad (not labeled), and the electronic components 212 can transmit an antenna signal via the antenna pad.

The monopole coupling antenna 22 has a sheet-like grounding radiating metal 221 and a sheet-like monopole radiating metal 222 arranged apart from the grounding radiating metal 221. The grounding radiating metal 221 in the instant embodiment is rectangular shape or square shape, and the contour of the grounding radiating metal 221 is greater than the contour of the grounding pads 214. However, in practical use, the construction of the grounding radiating metal 221 can be changed according to the lay-out of the packaged chip or the required coupling level, that is to say, the construction of the grounding radiating metal 221 is not limited to the embodiment. The grounding radiating metal 221 is substantially arranged on a center portion of the clearance area 12 of the circuit board 1.

The grounding pads 214 of the packaged chip 21 is welded on the grounding radiating metal 221 for establishing electrical connection of the electronic components 212 and the grounding radiating metal 221. The grounding pads 214 are approximately arranged in an area of the bottom surface 21b of the packaged chip 2, and the area of the bottom surface 21b is defined by an orthogonal projection of the grounding radiating metal 221 onto the bottom surface 21b (as shown in FIG. 3 or FIG. 5).

The monopole radiating metal 222 has a feeding point P. The monopole radiating metal 222 is disposed on the insulating body 213 of the packaged chip 21, and the monopole radiating metal 222 is arranged apart from the electronic components 212 and the grounding radiating metal 221. That is to say, the monopole radiating metal 222 is arranged apart from the electronic component 212 in a predetermined distance to avoid electrical shorting between the monopole radiating metal 222 and the electronic components 212.

The construction of the monopole radiating metal 222 can be changed according to designer's demand, and the forming manner of the monopole radiating metal 222 can be by laser carving or insert molding, but the monopole radiating metal 222 is not limited thereto. In more detail, the monopole radiating metal 222 in the instant embodiment has a sheet-like main portion 2221 and a supporting portion 2222. The supporting portion 222 bents and extends from the main portion 2221. The supporting portion 2222 in the instant embodiment means four upright sheets respectively extended from four corners of the main portion 2221.

Moreover, in the instant embodiment, the main portion 2221 of the monopole radiating metal 222 is arranged on the top surface 21a of the packaged chip 21 and exposed from the insulating body 213. The supporting portion 2222 is disposed on the substrate 221 and embedded in the insulating body 213. However, in practical use, the arrangement of the main portion 2221 and the supporting portion 2222 is not limited to the instant embodiment. Additionally, in terms of an electronic component 212' having larger thickness, when the distance between the electronic component 212' and the top surface 21a of the packaged chip 21 is smaller than the predetermined distance (as shown in FIG. 4), the main portion 2221 is arranged outside an area of the top surface 21a, and the area of the top surface 21a is defined by an orthogonal projection of the electronic component 212' onto the top surface 21a, thereby maintaining the predetermined distance between the main portion 2221 and the electronic component 212'.

Based on the above, the packaged chip 21 and the monopole coupling antenna 22 are disposed on the clearance area 12 of the circuit board 1, so that the packaged chip 21 does not occupy the available area of the circuit board 1, which is arranged outside the clearance area 12.

The grounding circuit 3 is disposed on the circuit board 1, and the grounding circuit 3 is connected to the grounding portion 11 and the grounding radiating metal 221 to establish electrical connections with the electronic components 212, the grounding radiating metal 221, and the grounding portion 11.

The grounding circuit 3 and the grounding radiating metal 221 in the instant embodiment are integrally formed in one piece and are disposed on the circuit board 1, but the grounding circuit 3 and the grounding radiating metal 221 are not limited thereto. For example, the grounding circuit 3 and the grounding radiating metal 221 can be directly formed on the circuit board 1.

The feeding circuit 4 is electrically connected to one of the signal pads 215 of the packaged chip 21 (i.e., the antenna pad) and the feeding point P of the monopole radiating metal 222. Specifically, one end of the feeding circuit 4 (i.e., the left end of the feeding circuit 4 as shown in FIG. 3) is connected to the antenna pad of the packaged chip 21, and another end of the feeding circuit 4 (the right end of the feeding circuit 4 as shown in FIG. 3) is connected to the supporting portion 2222 of the monopole radiating metal 222. In the instant embodiment, a portion of the monopole radiating metal 222 connected to the feeding circuit 4 is defined as the feeding point P.

Moreover, the feeding circuit 4 has a matching circuit 41 approximately arranged outside the clearance area 12, and the matching circuit 41 is arranged between the packaged chip 21 and the monopole radiating metal 222. The matching circuit 41 is electrically connected to the packaged chip 21 and the monopole radiating metal 222 for impedance adjustments and to establish matching impedance between the monopole coupling antenna 22 and packaged chip 21, thereby providing the maximum energy output.

In more detail, the monopole radiating metal 222 is configured to non-contact coupling with the grounding radiating metal 221, the electronic components 212, and the grounding circuit 3 when the packaged chip 21 transmits a signal to the monopole radiating metal 222 via the feeding circuit 4. Thus, the chip-type antenna device 100 is provided to avoid the weak performance of the antenna, which is generated by the antenna closer to the metallic portion of the electronic component of the chip. That is to say, the chip-type antenna device 100 of the instant embodiment has better antenna performance due to the non-contact coupling between the monopole radiating metal 222, the grounding radiating metal 221, the electronic components 212, and the grounding circuit 3.

Figure 6:
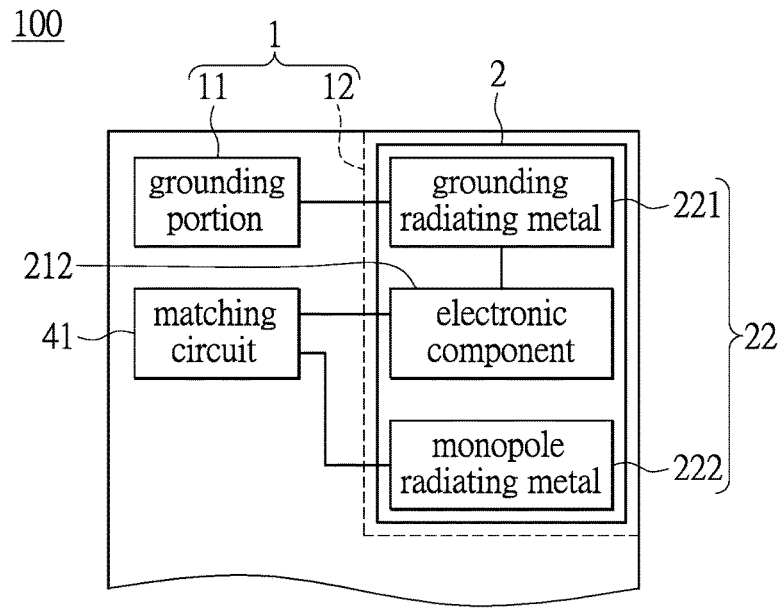
FIG. 6 is a functional block view of the chip-type antenna device according to the instant disclosure.

Besides, the signal transmission between the monopole radiating metal 222 and the electronic components 212 is provided by the feeding circuit 4 (as shown in FIG. 6), but it is not limited thereto.

Figure 7:
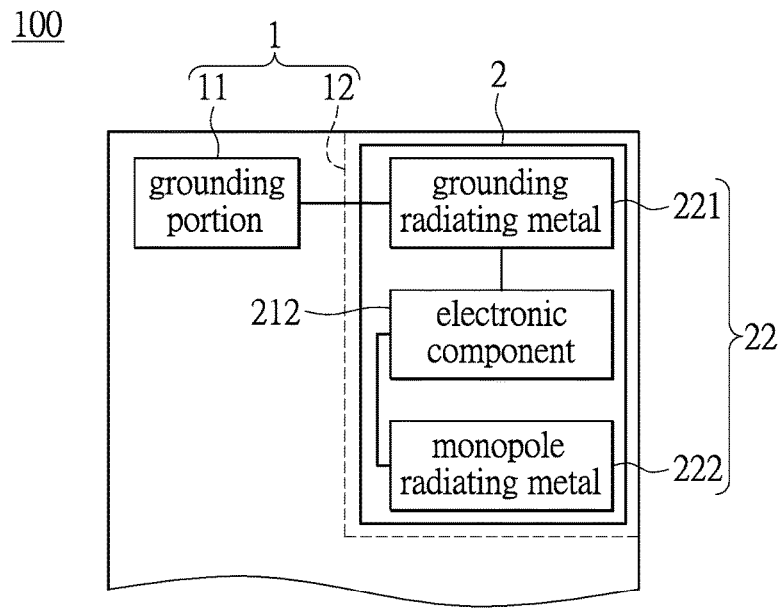
FIG. 7 is a functional block view of the chip-type antenna device in another embodiment according to the instant disclosure.
Figure 8:
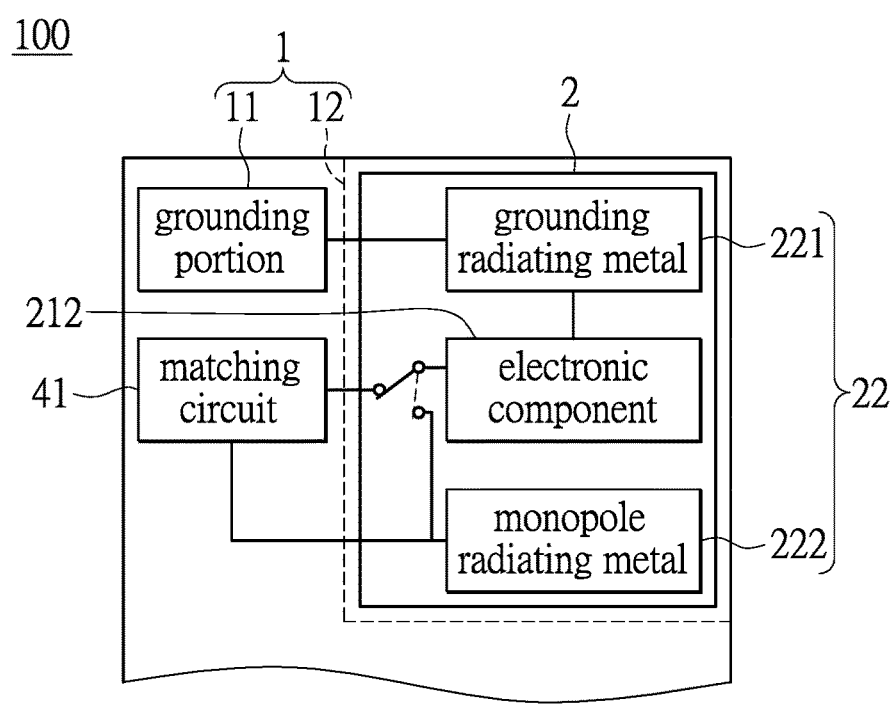
FIG. 8 is a functional block view of the chip-type antenna device in yet another embodiment according to the instant disclosure.

For example, as shown in FIG. 7, the feeding circuit 4 is built-in the chip structure 2 for transmitting the signal in the chip structure 2, thereby simplifying the construction of the chip-type antenna device 100; or as shown in FIG. 8, the feeding circuit 4 further has a switch (not labeled) for controlling the signal transmission manner (e.g., transmitting the signal in or out of the chip structure 2).

[The Probable Effect of the Above Embodiments]

Base on the above disclosure, the monopole radiating metal is disposed on the packaged chip and arranged apart from the grounding radiating metal and the electronic components, and the monopole radiating metal as non-contact coupling with the grounding radiating metal and the electronic components when the packaged chip transmits signal to the monopole radiating metal via the feeding circuit, such that the chip-type antenna device of the instant disclosure can operate the function of the monopole coupling antenna.

It should be noted that if taking an antenna on a chip, the weak performance of the antenna will be generated by the antenna closer to the metallic portion of the electronic component of the chip. But the chip-type antenna device of the instant disclosure can combine the monopole coupling antenna to the packaged chip without interference, thereby effectively utilizing the circuit board and providing maximum energy output.

Moreover, the packaged chip and the monopole coupling antenna are disposed on the clearance area of the circuit board, so that the packaged chip does not occupy the available area of the circuit board outside the clearance area. Thus, the available area of the circuit board of the instant disclosure is larger than the conventional antenna device.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A chip-type antenna device, comprising:
   a circuit board having a grounding portion;
   a packaged chip having an insulating body and at least one electronic component embedded in the insulating body, wherein the packaged chip has a plurality of grounding pads and a plurality of signal pads, the grounding pads and the signal pads are arranged on a bottom surface of the packaged chip and are electrically connected to the electronic component;
   a monopole coupling antenna, comprising:
      a grounding radiating metal disposed on the circuit board, wherein the grounding pads are connected to the grounding radiating metal; and
      a monopole radiating metal disposed on the insulating body of the packaged chip, the monopole radiating metal having a feeding point arranged on the bottom surface of the packaged chip, wherein the monopole radiating metal is arranged apart from the electronic component and the grounding radiating metal, the insulating body structurally and electrically isolates the monopole radiating metal from the electronic component, and the monopole radiating metal does not contact any conductor embedded in the insulating body;
   a grounding circuit formed on the circuit board and connected to the grounding portion of the circuit board and the grounding radiating metal; and
   a feeding circuit disposed on the circuit board;
   wherein the packaged chip and the monopole radiating metal disposed on the insulating body are mounted on the circuit board, the feeding circuit is electrically connected to the feeding point of the monopole radiating metal and one of the signal pads of the packaged chip, and the grounding pads are connected to the grounding radiating metal;
   wherein the monopole radiating metal is configured to non-contact coupling with the grounding radiating metal and the electronic component when the packaged chip transmits a signal to the monopole radiating metal via the feeding circuit.

2. The chip-type antenna device as claimed in claim 1, wherein the packaged chip has a substrate, the electronic component is disposed on the substrate, the grounding pads and the signal pads are formed on the substrate; wherein the monopole radiating metal has a main portion and a supporting portion, the supporting portion bents and extends from the main portion, and the supporting portion is disposed on the substrate.

3. The chip-type antenna device as claimed in claim 2, wherein the monopole radiating metal is arranged apart from the electronic component with a predetermined distance therebetween, the main portion is arranged on a top surface of the package structure, the supporting portion is embedded in the insulating body.

4. The chip-type antenna device as claimed in claim 3, wherein a distance between the electronic component and the top surface of the packaged chip is smaller than the predetermined distance, the main portion is arranged outside an area of the top surface, and the area of the top surface is defined by an orthogonal projection of the electronic component onto the top surface.

5. The chip-type antenna device as claimed in claim 3, wherein the grounding pads are arranged in an area of the bottom surface, and the area of the bottom surface is defined by an orthogonal projection of the grounding radiating metal onto the bottom surface.

6. The chip-type antenna device as claimed in claim 1, wherein the circuit board defines a clearance area thereon, the packaged chip and the monopole coupling antenna are disposed on the clearance area of the circuit board.

7. The chip-type antenna device as claimed in claim 6, wherein the feeding circuit has a matching circuit arranged on the circuit board outside the clearance area.

8. A chip structure for mounting on a clearance area of a circuit board, comprising:
   a packaged chip having an insulating body and at least one electronic component embedded in the insulating body, wherein the packaged chip has a plurality of grounding pads arranged on a bottom surface of the packaged chip, and the plurality of grounding pads are electrically connected to the electronic component; and
   a monopole coupling antenna, comprising:
      a grounding radiating metal for being disposed on the clearance area of the circuit board, wherein the grounding pads are connected to the grounding radiating metal; and
      a monopole radiating metal disposed on the insulating body of the packaged chip, the monopole radiating metal having a feeding point arranged on the bottom surface of the packaged chip, wherein the monopole radiating metal is arranged apart from the electronic component and the grounding radiating metal, the insulating body structurally and electrically isolates the monopole radiating metal from the electronic component, and the monopole radiating metal does not contact any conductor embedded in the insulating body;
   wherein when the packaged chip is electrically connected to the feeding point of the monopole radiating metal by a feeding circuit, and the grounding radiating metal is connected to the circuit board by a grounding circuit, the packaged chip transmits a signal to the monopole radiating metal via the feeding circuit, and the monopole radiating metal is coupled in a non-contact manner with the grounding radiating metal and the electronic component during.

9. The chip structure as claimed in claim 8, wherein the packaged chip has a substrate, the electronic component is disposed on the substrate, the grounding pads are formed on the substrate; wherein the monopole radiating metal has a main portion and a supporting portion, the supporting portion bents and extends from the main portion, and the supporting portion is disposed on the substrate.

10. The chip structure as claimed in claim 9, wherein the grounding pads are arranged in an area of the bottom surface, and the area of the bottom surface is defined by an orthogonal projection of the electronic component onto the bottom surface, wherein the monopole radiating metal is arranged apart from the electronic component with a predetermined distance therebetween, the main portion is arranged on a top surface of the package chip, the supporting portion is embedded in the insulating body, and wherein the distance between the electronic component and the top surface of the packaged chip is smaller than the predetermined distance, the main portion is arranged outside an area of the top surface, and the area of the top surface is defined by an orthogonal projection of the grounding radiating metal onto the top surface.

* * * * *